(12) United States Patent
Bryant

(10) Patent No.: US 11,262,248 B2
(45) Date of Patent: Mar. 1, 2022

(54) ANALYZING AN OPERATION OF A POWER SEMICONDUCTOR DEVICE

(71) Applicant: Maschinenfabrik Reinhausen GmbH, Regensburg (DE)

(72) Inventor: Angus Bryant, Cambridge (GB)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 0 days.

(21) Appl. No.: 17/276,896

(22) PCT Filed: Sep. 19, 2019

(86) PCT No.: PCT/EP2019/075229
§ 371 (c)(1),
(2) Date: Mar. 17, 2021

(87) PCT Pub. No.: WO2020/058437
PCT Pub. Date: Mar. 26, 2020

(65) Prior Publication Data
US 2021/0318176 A1 Oct. 14, 2021

(30) Foreign Application Priority Data
Sep. 21, 2018 (EP) ..................................... 18196068

(51) Int. Cl.
*G01R 31/26* (2020.01)
*G01K 7/01* (2006.01)

(52) U.S. Cl.
CPC ........... *G01K 7/015* (2013.01); *G01R 31/263* (2013.01); *G01R 31/2619* (2013.01);
(Continued)

(58) Field of Classification Search
CPC ............ G01R 31/2619; G01R 31/2628; G01R 31/263; G01R 31/2632; G01R 31/27;
(Continued)

(56) References Cited

U.S. PATENT DOCUMENTS

| 7,773,350 B2 * | 8/2010 | Balakrishnan | .......... H02M 1/32 361/18 |
| 7,830,269 B2 * | 11/2010 | Cheng | .................... G01R 31/64 340/635 |

(Continued)

FOREIGN PATENT DOCUMENTS

EP 1860446 A1 11/2007

*Primary Examiner* — Vinh P Nguyen
(74) *Attorney, Agent, or Firm* — Leydig, Voit & Mayer, Ltd.

(57) ABSTRACT

A method analyzes an operation of a power semiconductor device. The method includes: providing a set of reference voltages of the power semiconductor device and a set of corresponding reference currents; measuring an on-state voltage and a corresponding on-state current of the power semiconductor device to obtain a measurement point; adapting the set of reference voltages by adapting two of the set of reference voltages lying closest to the measurement point by extrapolating the measurement point; and using the adapted set of reference voltages to analyze the operation of the power semiconductor device. The extrapolation is based on a predefined reference increment current and a predefined reference increment voltage.

16 Claims, 3 Drawing Sheets

(52) U.S. Cl.
CPC ..... *G01R 31/2628* (2013.01); *G01R 31/2632* (2013.01); *G01K 2217/00* (2013.01)

(58) Field of Classification Search
CPC .......................... G01R 31/2834; G01R 31/26; G01R 31/2608; G01R 31/327; G01R 31/42; G01R 31/2601; G01R 1/0425; G01R 31/007; G01R 31/1236; G01R 31/2607; G01R 31/2633; G01R 31/2642; G01R 31/2848; G01R 31/2849; G01R 31/2879; G01R 31/3336; H02H 3/006; H02H 7/122; H02H 5/04; G01K 1/026; G01K 1/12; G01K 7/22; G01K 7/42; G01K 2217/00; G01K 7/015; H02M 1/32; H02M 1/327; H03K 17/0822; H03K 17/0828; H03K 2017/0806; H03K 17/0414; H03K 17/08128; H03K 17/18; H03K 17/28; H03K 17/284; H03K 17/567; H03K 17/60; H03K 17/691; H03K 17/74
See application file for complete search history.

(56) References Cited

U.S. PATENT DOCUMENTS

| | | | |
|---|---|---|---|
| 9,494,857 B2 * | 11/2016 | Nakai | B29C 43/222 |
| 9,880,575 B2 * | 1/2018 | Tai | G05F 1/575 |
| 2012/0187975 A1 | 7/2012 | Koh et al. | |

* cited by examiner

ANALYZING AN OPERATION OF A POWER SEMICONDUCTOR DEVICE

CROSS-REFERENCE TO PRIOR APPLICATIONS

This application is a U.S. National Phase Application under 35 U.S.C. § 371 of International Application No. PCT/EP2019/075229, filed on Sep. 19, 2019, and claims benefit to European Patent Application No. EP 18196068.3, filed on Sep. 21, 2018. The International Application was published in English on Mar. 26, 2020 as WO 2020/058437 under PCT Article 21(2).

FIELD

The present invention relates to a method and a circuit for analyzing an operation of a power semiconductor device and to a power electronic system comprising such circuit.

BACKGROUND

In power electronic systems, for example power converters, the junction temperature of power semiconductor devices is a critical quantity setting a limit on system operation. Exceeding an absolute limit may be regarded as catastrophic and thermal behavior throughout the lifetime of the system affects reliability and rate of degradation. However, the devices themselves, for example insulated gate bipolar transistors, IGBTs, MOSFETs, thyristors or diodes are electrically "live" and in an electrically highly noisy environment, so direct measurement of the junction temperature may be not feasible.

The junction temperature may, however, be estimated based on temperature-sensitive electrical parameters, TSEPs, associated with the semiconductor device. Existing approaches have estimated the junction temperature from TSEPs at very low currents, namely in the milliamp regime, which is typically less than 1% of the rated current of a power electronic system. Therefore, such method is not applicable to the majority of applications of power electronic systems and may be useful only in specific lab setups. Other approaches have estimated the junction temperature at high current, for example 10 to 100% of the rated current. In this case, a look-up table or equation may be fitted to prior calibration data measured across a range of junction temperatures and on-state (i.e. forward) currents. However, this requires a detailed and accurate calibration of each system prior to use, which is impractical for industrial applications.

SUMMARY

In an embodiment, the present invention provides a method that analyzes an operation of a power semiconductor device. The method includes: providing a set of reference voltages of the power semiconductor device and a set of corresponding reference currents; measuring an on-state voltage and a corresponding on-state current of the power semiconductor device to obtain a measurement point; adapting the set of reference voltages by adapting two of the set of reference voltages lying closest to the measurement point by extrapolating the measurement point; and using the adapted set of reference voltages to analyze the operation of the power semiconductor device. The extrapolation is based on a predefined reference increment current and a predefined reference increment voltage.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1A:
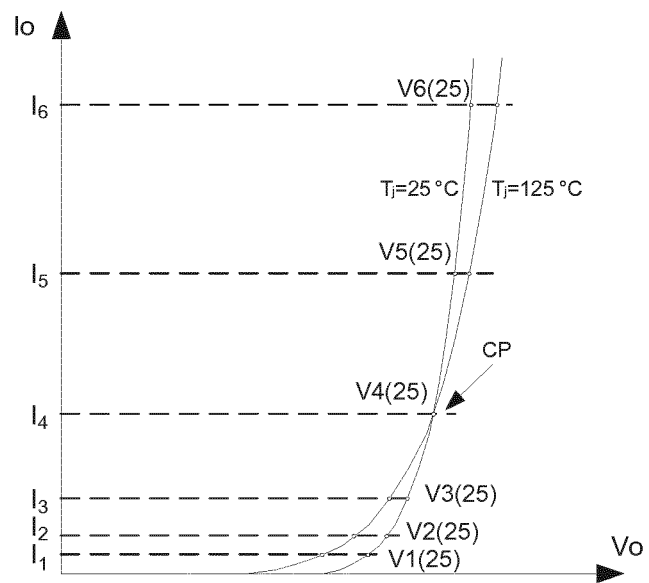
FIG. 1A shows on-state current versus on-state voltage of a power semiconductor device at two different junction temperatures.

Embodiments of the present invention provide an improved concept for analyzing an operation of a power semiconductor device that is applicable at on-state currents at least up to the rated current and does not require a prior calibration.

An improved concept of the present invention is based on the idea to utilize an on-state voltage of the power semiconductor device as TSEP and to effectively remove the dependency of the on-state voltage on the on-state current, leaving just a dependency on junction temperature. This is achieved by assigning measurement points to predefined bins, correcting the bins for local gradients of a respective IV-characteristics by extrapolation and optionally filtering the extrapolated values over a specific time-interval. This results in an effective online calibration, that is carried out during normal operation, which makes an actual calibration prior to usage obsolete.

According to the present invention, a method for analyzing an operation of a power semiconductor device is provided. A set of reference voltages of the device and a set of corresponding reference currents of the device are provided. An on-state voltage and an on-state current of the device are measured, the measured voltage and current representing a measurement point. The set of reference voltages is adapted by adapting those two reference voltages, in particular adjacent, of the set of reference voltages lying closest to the measurement point. In particular, those two adjacent reference voltages are adapted that correspond to those two adjacent reference currents lying closest to the measured on-state current. The adaption involves extrapolating the measurement point, in particular the measured on-state voltage, wherein the extrapolation is based on a predefined reference increment current and a predefined reference increment voltage. Then, the adapted set of reference voltages is used to analyze the operation of the power semiconductor device.

The reference voltages and reference currents are reference on-state voltages and currents, respectively. In particular, the set of reference voltages and reference currents may correspond to a discrete set of points on a reference I-V-characteristics of the power semiconductor device, in particular at an intermediate temperature. The intermediate temperature may lie for example in the range of 50-100° C., for example 70-80° C., in particular 75° C. The reference increment voltage and current correspond to a voltage and current difference, respectively, between the two discrete points on the reference I-V-characteristics lying closest to the measurement point.

The two of the set of reference voltages lying closest to the measurement point and therefore are adapted are determined as follows. One of the two the reference voltages is the closest smaller reference voltage to the measured on-state voltage. The other one of the two the reference voltages is the closest greater reference voltage to the measured on-state voltage. In other words, the two of the set of reference voltages lying closest to the measurement point are those two of the set of reference voltages adjacent to the measured on-state voltage.

According to some implementations of the method, the analysis of the operation of the power semiconductor device comprises estimating a junction temperature of the device based on the adapted set of reference voltages.

According to some implementations, the analysis of the operation of the power semiconductor device comprises determining a shift in the on-state voltage over time.

The shift of the on-state voltage represents an electrical degradation of the power semiconductor device. These implementations are in particular suitable in case there exists a temperature-invariant point in a current-voltage characteristic of the power semiconductor device and one of the reference currents corresponds to the invariant point.

According to some implementations, the extrapolation comprises determining a difference between the measured on-state current and one of those two of the set of reference currents lying closest to the measured on-state current. The extrapolation further comprises determining a ratio of the difference to the reference increment current.

Which one of the two of the set of reference currents lying closest to the measured on-state current is chosen affects the result only in a trivial way, namely by shifting the ratio by 1. The choice should only be consistent throughout the method.

The determined ratio represents a relative distance between the measured on-state current and the two closest lying reference currents.

According to some implementations, the extrapolation further comprises adapting those two of the set of reference voltages lying closest to the measurement point based on the determined ratio.

For example, for the closest lying reference voltage being smaller than the measured on-state voltage, the adaption involves subtracting from the measured on-state voltage a product of the determined ratio and the reference increment voltage. For example, for the closest lying reference voltage being greater than the measured on-state voltage, the adaption involves subtracting from the measured on-state voltage a product of the determined ratio and the reference increment voltage and adding the reference increment voltage.

According to some implementations, the steps of providing the plurality of reference voltages and the plurality of reference currents, obtaining the measurement point and adapting the plurality of reference voltages are performed N times within a predetermined time-interval, resulting in N adapted sets of reference voltages. Therein, N is an integer number equal to or greater than 2.

It is noted that, in each of the N adapted sets of reference voltages, only two reference voltages are adapted in the way described above. Since the measurement point is in general not strictly constant in time, different sets of the N sets may have different reference voltages been adapted.

According to some implementations, the analysis comprises determining a set of average voltages based on the N adapted sets of reference voltages and estimating the junction temperature of the device based on the set of average voltages.

According to some implementations, the determination of the set of average voltages comprises determining at least one time average, in particular weighted time average, over N corresponding reference voltages of the N different adapted sets of reference voltages.

Here, corresponding reference voltages are such reference voltages corresponding to the same reference current on the reference I-V-characteristics or the respective adapted reference voltages.

According to some implementations, the step of estimating the junction temperature comprises determining for each voltage of each of the N adapted sets of reference voltages a validity factor resulting in N sets of validity factors. Therein, the validity factor for a voltage is given by a relative distance between the respective measured on-state current and one of the reference currents corresponding to the voltage for which the validity factor is to be determined.

This means, the validity factor for adapted reference voltages correspond to the determined ratio. For other reference voltages, it is determined analogously. Consequently, within one set of the N sets of validity factors, the largest validity factor is the one for the reference voltage or adapted reference voltage of the corresponding adapted set of reference voltages, lying closest to the measured on-state voltage.

According to some implementations, respective weighting factors for determining the weighted time averages are given by the N sets of validity factors. In particular, the respective weighting factor for a given voltage is given by the validity factor determined for this given voltage.

According to some implementations, the step of estimating the junction temperature comprises determining a set of average validity factors based on the N sets of validity factors and estimating the junction temperature based on the set of average validity factors.

According to some implementations, the determination of the set of average validity factors comprises determining respective time averages over corresponding validity factors of the N sets of validity factors.

Here, corresponding validity factors are those for corresponding reference voltages as explained above.

According to some implementations, the step estimating the junction temperature comprises calculating an estimated value for the junction temperature based on an assumed linear relationship between the estimated value for the junction temperature and one of the set of average voltages.

According to some implementations, the step estimating the junction temperature comprises calculating a plurality of estimated values for the junction temperature based on respective assumed linear relationships between each estimated value for the junction temperature and a respective one of the set of average voltages. Each of the plurality of estimated junction temperatures is weighted according to a respective average validity of the set of average validities. The weighted estimated values for the junction temperature may then be added up and for example normalized to obtain a final estimate for the junction temperature.

According to the improved concept, also a circuit for analyzing an operation of a power semiconductor device is provided. The circuit comprises a measuring unit, a storage unit and an evaluation unit. The measuring unit is configured to measure an on-state voltage and an on-state current of the power semiconductor device to obtain a measurement point. The storage unit is configured to store a set of reference voltages of the device and a set of corresponding reference currents of the device. The storage unit is further configured to store a predefined reference increment current for each pair of adjacent reference currents and a predefined reference increment voltage for each pair of adjacent reference voltages.

The evaluation unit is configured to adapt the set of reference voltages by adapting those two of the set of reference voltages lying closest to the measurement point by extrapolating the measurement point. The extrapolation is based on the respective reference increment current and the respective reference increment voltage. The evaluation unit is further configured to analyze the operation of the power semiconductor device based on the adapted set of reference voltages.

According to an embodiment of the present invention, also a power electronic system is provided. The circuit comprises a circuit according to the improved concept and the power semiconductors device.

According to some implementations, the power semiconductor device comprises a diode, in particular a PIN diode or a Schottky diode or a thyristor or a field effect transistor, for example a MOSFET, a JFET or an HEMT, or a bipolar transistor, for example an IGBT or a BJT.

According to some implementations of the power electronic system, the power electronic system comprises a power converter. The power converter comprises the power semiconductor device.

Further implementations of the circuit according to the improved concept follow readily from the various implementations of the method according to the improved concept and vice versa. Further implementations of the power electronic system according to the improved concept follow readily from the various implementations of the method according to the improved concept and vice versa.

In the following, the present invention is explained in detail with respect to exemplary implementations by reference to the drawings.

FIG. 1A shows exemplary curves of on-state current Io versus on-state voltage Vo of a power semiconductor device at a junction temperature Tj of 25° C. and of 125° C. two different junction temperatures. The curves cross at a crossing point CP. A discrete set of six currents I1, I2, . . . , I6 and corresponding voltages V1(25), V2(25), . . . , V6(25) at Tj=25° C. are marked. Of course, the number of six currents is an arbitrary example and could be any number equal to or greater than 2.

Figure 1B:
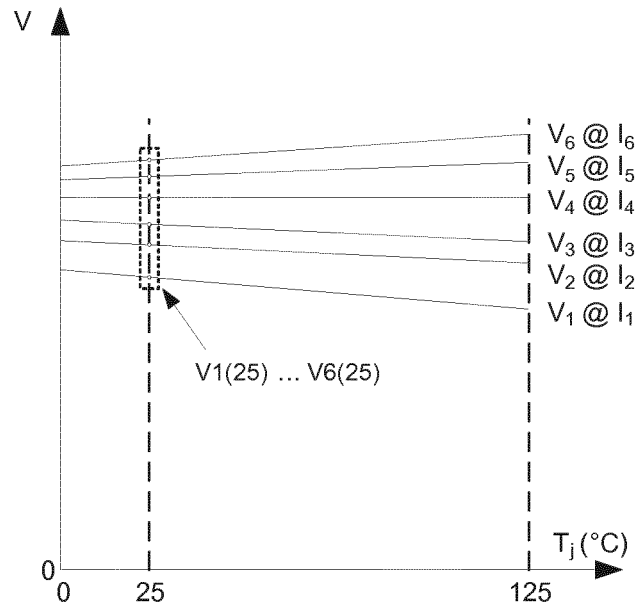
FIG. 1B shows on-state voltage versus junction temperature of a power semiconductor device at different on-state currents.

FIG. 1B shows a Tj-dependence of the voltages V1(25), . . . , V6(25). One can see, that voltages below the crossing point CP show a negative temperature coefficient, that is decrease with increasing Tj for fixed current, while the voltages above the crossing point CP show a positive temperature coefficient, that is increase with increasing Tj for fixed current.

The crossing point CP does not show a Tj-dependence. For some power semiconductor devices, for example some PIN diodes, the crossing point CP may be close to or above the rated current. For other power semiconductor devices, for example insulated-gate bipolar transistors, IGBTs, the crossing point may be below 10% of the rated current. Still other power semiconductor devices may have no single crossing point CP, for example due to non-linear temperature dependence of the on-state voltage.

Due to the described temperature dependence, an analysis of an operation of a power semiconductor device based on the forward voltage is complicated. According to the improved concept, nevertheless a meaningful analysis can be carried out without prior calibration and without significant restrictions to the applicable current range, as described above and in the following.

Figure 2:
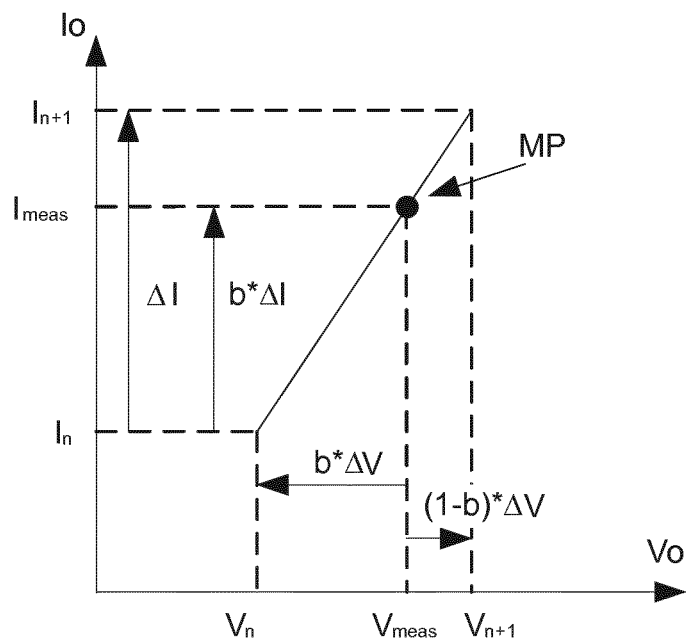
FIG. 2 shows an I-V-diagram representing parts of an exemplary implementation of a method according to the improved concept.
Figure 3:
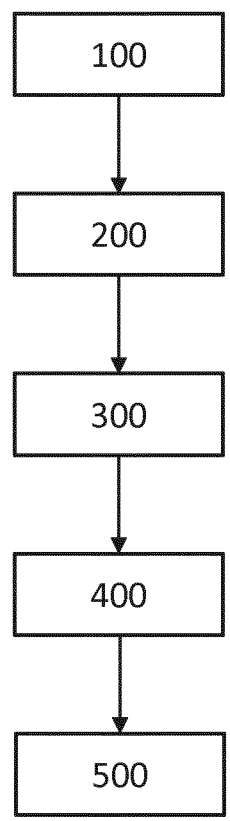
FIG. 3 shows a flow diagram of a further exemplary implementation of a method according to the improved concept.

Exemplary implementations of a method according to an embodiment of the present invention are now explained with respect to FIGS. 2 and 3.

In step 100 of FIG. 3, a set of reference voltages, in particular reference on-state voltages, of a power semiconductor device and a set of corresponding reference currents, in particular reference on-state currents, of the device are determined. For example, the reference voltages and currents may be predefined nominal quantities, for example defined in the datasheet, of the power semiconductor device at a predefined junction temperature or they may be predetermined quantities measured at a defined junction temperature.

In step 200, an on-state voltage Vmeas and a corresponding on-state current Imeas are measured. The measured values represent a measurement point MP.

FIG. 2 shows the measurement point MP as well as two reference voltages Vn, Vn+1 and corresponding reference currents In, In+1. Therein In is the reference current lying next to the measured on-state current Io, which is smaller than the measured on-state current Io, that is a lower reference current In. In+1 is the reference current lying next to the measured on-state current Io, which is greater than the measured on-state current Io, that is an upper reference current In+1. The same holds analogously for the respective voltages.

FIG. 2 also shows a reference increment current $\Delta I$, which is given by a distance between the adjacent reference currents In and In+1. Further, a reference increment voltage $\Delta V$ is shown, which is given by a distance between the adjacent reference voltages Vn and Vn+1.

Furthermore, a distance between the measured on-state current Imeas and the lower reference current In is given by $b*\Delta I$. A distance between the lower reference voltage Vn and the measured on-state voltage Vm is given by $b*\Delta V$, while a distance between the upper reference voltage Vn+1 and the measured on-state voltage Vm is given by $(1-b)*\Delta V$.

That means, b represents a relative distance between the measured on-state current Imeas and the lower reference current In, as well as between the lower reference voltage Vn and the measured on-state voltage Vm.

In step 300, the set of reference voltages is adapted by adapting the two adjacent reference voltages Vn, Vn+1 adjacent to the measurement point MP. To this end, the measurement point is extrapolated based on the reference increment voltage $\Delta V$ and the reference increment current $\Delta I$.

For the extrapolation, b is calculated according to the equation:

$$b=(I\text{meas}-In)/(In+1-In)=(I\text{meas}-In)/\Delta I. \qquad (1)$$

Then, the reference voltages Vn, Vn+1 are adapted according to the rules:

$$Vn \rightarrow V\text{meas}-b*\Delta V, \qquad (2)$$

$$Vn+1 \rightarrow V\text{meas}+(1-b)*\Delta V. \qquad (3)$$

The adapted reference voltages Vn, Vn+1 can be used as current independent estimates for the measured on-state voltage Vmeas. In a sense, the described procedure represents a binning of the measured on-state voltage Vm with a correction due to local gradients.

The relative distance b affects the accuracy of this estimation because the reference increments ΔV, ΔI, are in general only exact for a specific junction temperature and matching device characteristics. As b approaches zero, the accuracy improves for the lower adapted reference voltage Vn, while as b approaches one, the accuracy improves for the upper adapted reference voltage Vn+1.

Therefore, the accuracy may be improved by repeating the steps 100, 200, and 300 N times within a sample time-interval and averaging the adapted reference voltages in step 400. The average, however, involves a weighting of the individual adapted reference voltages according to their respective validities or accuracies, respectively.

In a given repetition k, the validity of the lower adapted reference voltage Vn is given by Wn=(1−b) and the validity of the upper adapted reference voltage Vn+1 is given by Wn+1=b. A corresponding validity may be calculated analogously for each of the reference voltages, even if they are not adjacent to the measured on-state voltage Vmeas and therefore are not adapted in the given repetition k. For example, the validity for non-adjacent reference voltages may be defined to be zero. At the end of the sample time-interval, an average validity Wi_av may be calculated for each voltage Vi of the adapted sets of reference voltages according to the formula:

$$Wi\_av = \Sigma Wi(k)/N. \quad (4)$$

The corresponding average voltage is then given by:

$$Vi\_av = (\Sigma Wi(k)*Vi(k))/(Wi\_av*N). \quad (5)$$

Herein, the sums Σ runs over all repetitions k within the sample time-interval. In case the average validity Wi_av is equal to zero for a specific reference voltage Vi, the corresponding average voltage Vi_av is not calculated to avoid a divide by zero in equation (5). This specific average voltage Vi_av can be ignored in the further processing.

The average validity Wi_av for a particular average voltage Vi_av provides an indication of a confidence in the accuracy of the voltage estimate.

A duration of the sample time interval may for example be selected as a compromise between a long duration to achieve improved averaging and a short duration so that the assumption of approximately constant junction temperature throughout the time-interval is valid.

In step 500, the set of average voltages is used to analyze the operation of the power semiconductor device.

In particular, the analysis may involve selecting the average voltage with the greatest validity factor and calculating an estimated value for the junction temperature based on an assumed linear relationship between the junction temperature and the selected average voltage.

For example, the analysis may involve calculating a respective estimated value for the junction temperature based on the assumed linear relationship for several or all of the averaged voltages. Then, a weighted average of the estimated value for the junction temperature may be determined. The weighting may be performed according to the respective average validities.

Figure 4:
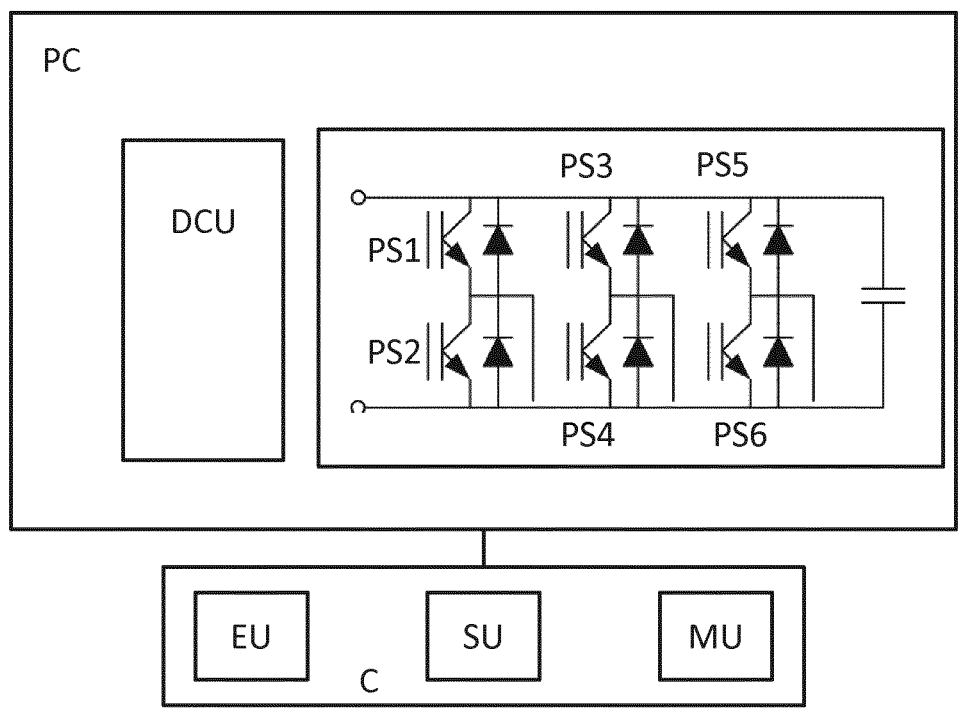
FIG. 4 shows a block diagram of an exemplary implementation of a power electronic system according to the improved concept.

FIG. 4 shows a block diagram of an exemplary implementation of a power electronic system according to the improved concept. In particular, the power electronics system is configured to perform a method according to the improved concept as described with respect to FIGS. 2 and 3.

The system comprises a circuit C according to the improved concept and a power electronics device, for example a power converter PC, coupled to the circuit C. The power converter PC comprises one or more power semiconductor devices PS1, PS2, . . . , PS6, for example IGBTs. The number of power semiconductor devices being equal to six in FIG. 4 serves merely for illustratory reasons and can differ from three. In the example of FIG. 4, the devices PS1, . . . , PS6 are depicted as part of a six-switch three-phase two-level inverter which is a standard application for a power converter. However, this is done only for illustration, no restriction is imposed by this example, since the improved concept does not rely on such structure.

Although in FIG. 4 circuit symbols for IGBTs of the depletion type are shown, this does not in any way restrict the methods or circuits or systems according to the involved concept. In particular, the power semiconductor devices PS1, PS2, PS3 may comprise IGBTs of the enhancement type or other transistors, thyristors or diodes. Also the power converter PC is only used as an example. In particular, it may be replaced with another power electronics device, for example a solid-state circuit breaker, a solid-state relay, a static VAR compensator or a switch-mode audio amplifier.

The power converter PC may for example comprise a drive and control unit DCU for driving and/or controlling the power semiconductor devices PS1, PS2, PS3.

The circuit C may be separate to the power converter PC as shown in FIG. 4. Alternatively, for example, the power converter PC or the drive and control unit DCU, may comprise the circuit C.

The circuit comprises a measuring unit MU for measuring the on-state voltage and current of at least one of the semiconductor devices PS1, PS2, PS3 and for communication with the power converter PC. The measuring unit MU may comprise for example one or more analogue to digital converters and/or a field-programmable gate array, FPGA. Alternatively, the measuring unit MU may comprise a micro-controller unit.

The circuit C further comprises a storage unit SU for storing the reference voltages, the reference currents and the reference increment voltages and currents. The SU is also for storing the adapted reference voltages, the validities as well as the average voltages and average validities.

In some implementations, the storage unit SU may be combined with the measuring unit MU, for example in the FPGA or micro-controller unit of the measuring unit MU.

The circuit C also comprises an evaluation unit EU, for example a microprocessor, for adapting the reference voltages, storing data to the storage unit SU and optionally for determining the estimate values for the junction temperature. In particular, the evaluation unit EU may be configured to perform all calculation steps described with respect to FIGS. 2 and 3. The evaluation unit EU may also be combined with the storage unit SU and/or the measuring unit MU.

By means of a method, a circuit or a system according to the improved concept, an operation of a power semiconductor device may be analyzed at least up to its rated current and without calibration prior to use. This is achieved by effectively binning (that is by extrapolation) the measured on-state voltage and optionally filtering (weighted averaging) the results over a suitable time-interval, for example in the order of 100 ms or hundreds of ms. The extrapolation allows an equivalent voltage to be calculated, which can be used to effectively perform a calibration online, that is during normal operation of the power semiconductor device or the system comprising the device, for example a power converter.

Embodiments of the present invention provide for a better trade-off of accuracy versus computational load. If, for example simple binning would be used, then either a large number of current bins would be required, increasing the computational load when using the resulting data, or large errors would be present in the resulting voltages.

According to embodiments of the present invention, high-current measurements of on-state voltage drop may be used avoiding an interference with normal converter operation or requiring special low-current sources to be switched in and out.

Also complex look-up tables may be avoided.

The measurement error may be greatly reduced by the improved concept the, since a large set of data may be used. Averaging across a time-interval may further improve confidence.

Systems or circuits according to the improved concept can cope with DC currents or very low frequency AC currents. In such cases only two reference currents will have valid data in a particular time-interval where the on-state current is approximately constant.

Implementations according to the improved concept may involve junction temperature estimation, which may enable several features in next generation of "smart" power converters, including: dynamic rating control (intelligent over-rate/de-rate), optimized parallel inverter stack current sharing, condition monitoring (detection of wear-out and abnormal operation, giving predictive maintenance), temperature cycle counting and remaining useful life estimation, improved validation of inverter stack design during development and type testing, improved over-temperature detection.

Resulting benefits to manufacturers of power converters may include an optimized performance (for example current rating or efficiency) versus cost, for example through reduction of margins. Benefits to the end users of power converters may include the early detection of abnormal operation and potentially reduced operating costs.

In an analog way as described, the method may also be applied to other current-dependent TSEPs, including switching characteristics, such as peak diode reverse recovery current, peak overshoot voltage, and so forth. Also TSEPs being not universal for essentially all power semiconductor devices may be handled in an analogous way, for example a gate threshold voltage or an internal gate resistance. One key aspect is to remove the operating-point (for example current) dependency by converting a measurement with both operating point and temperature dependency into a discrete set of measurements with only temperature dependency.

Furthermore, the method may also be used to analyze an operation of electric equipment apart from power electronics, in particular when some kind of hot spot temperature of interest is difficult to measure because of a harsh environment. This may for example be the case for power transformers, where a hot spot temperature or a winding temperature of the transformer may be of interest.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SIGNS

PC power converter
DCU drive and control unit
PS1, PS2, PS3 power semiconductor devices
C circuit
EU evaluation unit
SU storage unit
MU measuring unit
Io on-state current
Vo on-state voltage
Tj junction temperature
Vn, Vn+1 reference voltages, adapted reference voltages
In, In+1 reference currents
Imeas measured on-state current
Vmeas measures on-state voltage
MP measurement point
b relative distance
ΔI reference voltage increment
ΔV reference current increment

The invention claimed is:

1. A method for analyzing an operation of a power semiconductor device, the method comprising:
   providing a set of initial reference voltages of the power semiconductor device and a set of corresponding initial reference currents;
   measuring an on-state voltage and a corresponding on-state current of the power semiconductor device, and correlating the on-state voltage to the on-state current so as to obtain a measurement point;
   adapting the set of initial reference voltages using two of the set of initial reference voltages lying closest to the measurement point so as to obtain an adapted set of reference voltages by extrapolating the measurement point, wherein the extrapolation is based on a predefined reference increment current and a predefined reference increment voltage; and
   using the adapted set of reference voltages to analyze the operation of the power semiconductor device.

2. The method according to claim 1, wherein the analyzing comprises estimating a junction temperature of the power semiconductor device based on the adapted set of reference voltages.

3. The method according to claim 1, wherein the extrapolation comprises:
determining a difference between the measured on-state current and one of the two of the set of initial reference currents lying closest to the measured on-state current; and
determining a ratio of the determined difference to the reference increment current.

4. The method according to claim 3, wherein the extrapolation further comprises adapting the two of the set of initial reference voltages lying closest to the measurement point based on the determined ratio.

5. The method according to claim 1, wherein
the steps of providing the set of initial reference voltages and the set of initial reference currents, obtaining the measurement point and adapting the set of initial reference voltages are performed N times within a predetermined time-interval, resulting in N adapted sets of reference voltages, wherein N is an integer number equal to or greater than 2; and
wherein the analyzing comprises determining a set of average voltages based on the N adapted sets of reference voltages.

6. The method according to claim 5, wherein the determining of the set of average voltages comprises determining at least one weighted time average over N corresponding reference voltages of the N adapted sets of reference voltages.

7. The method according to claim 6, wherein respective weighting factors for the weighted time averages are given by the N sets of validity factors.

8. The method according to claim 5, wherein the step of estimating the junction temperature comprises:
determining for each voltage of each of the N adapted sets of reference voltages a validity factor resulting in N sets of validity factors;
wherein the validity factor for an adapted reference voltage is given by a relative distance between the respective measured on-state current and one of the reference currents corresponding to the adapted reference voltage.

9. The method according to claim 8, wherein the step of estimating the junction temperature comprises determining a set of average validity factors based on the N sets of validity factors and estimating the junction temperature based on the set of average validity factors.

10. The method according to claim 9, wherein the determining of the set of average validity factors comprises determining respective time averages over corresponding validity factors of the N sets of validity factors.

11. The method according to claim 9, wherein the step estimating the junction temperature comprises calculating an estimated value for the junction temperature based on an assumed linear relation between the estimated value for the junction temperature and one of the set of average voltages.

12. The method according to claim 9, wherein the step of estimating the junction temperature comprises:
calculating a plurality of estimated values for the junction temperature based on respective assumed linear relations between each estimated value for the junction temperature and a respective one of the set of average voltages;
weighting each of the plurality of estimated junction temperatures according to a respective average validity of the set of average validities.

13. The method according to claim 5, wherein the analyzing comprises estimating a junction temperature of the device based on the set of average voltages.

14. A circuit for analyzing an operation of a power semiconductor device, the circuit comprising:
a measuring unit configured to measure an on-state voltage and an on-state current of the power semiconductor device to obtain a measurement point; and
a storage configured to store:
a set of initial reference voltages of the power semiconductor device and a set of corresponding initial reference currents of the power semiconductor device;
a predefined reference increment current for each pair of adjacent initial reference currents and a predefined reference increment voltage for each pair of adjacent initial reference voltages; and
an evaluator configured to:
adapt the set of initial reference voltages using those two of the set of initial reference voltages lying closest to the measurement point to an adapted set of reference voltages by extrapolating the measurement point, wherein the extrapolation is based on the respective reference increment current and the respective reference increment voltage; and
analyze the operation of the power semiconductor device based on the adapted set of reference voltages.

15. A power electronic system comprising the circuit according to claim 14 and the power semiconductor device.

16. The power electronic system according to claim 15 comprising a power converter, the power converter comprising the power semiconductor device.

* * * * *